United States Patent [19]

Schröder

[11] 4,072,906
[45] Feb. 7, 1978

[54] VARIABLE GAIN AMPLIFIER WITH ADJUSTABLE UPPER FREQUENCY LIMIT

[75] Inventor: Ernst Schröder, Hannover, Germany

[73] Assignee: Licentia Patent-Verwaltungs G.m.b.H., Frankfurt am Main, Germany

[21] Appl. No.: 727,372

[22] Filed: Sept. 27, 1976

[30] Foreign Application Priority Data

Sept. 25, 1975 Germany .............................. 2542745

[51] Int. Cl.² ............................................... H03F 1/36
[52] U.S. Cl. ......................................... 330/86; 330/109
[58] Field of Search ..................... 330/86, 107, 109; 331/141, 110; 333/28 T; 328/167; 179/1 D, 100.1 TC

[56] References Cited

U.S. PATENT DOCUMENTS

| | | | |
|---|---|---|---|
| 2,264,715 | 12/1941 | Rohr et al. | 333/28 T X |
| 3,432,774 | 3/1969 | Fick | 331/110 X |
| 3,628,129 | 12/1971 | Riley | 330/107 X |
| 3,769,612 | 10/1973 | Yamazaki | 330/86 X |
| 3,835,418 | 9/1974 | Gilbert | 331/141 |
| 3,967,209 | 6/1976 | Skoures et al. | 330/86 |

Primary Examiner—James B. Mullins
Attorney, Agent, or Firm—Spencer & Kaye

[57] ABSTRACT

An amplifier circuit including a differential amplifier and having an effective transmission frequency band delimited by a lower limit frequency which can be varied by application of a control voltage is also given a defined upper limit frequency by connecting a resistance in series with a frequency dependent impedance between an inverting input of the amplifier and a point at the circuit reference potential. The value of the resistance can be adjusted to provide the desired upper limit frequency value and can be varied to change that frequency value.

2 Claims, 2 Drawing Figures

VARIABLE GAIN AMPLIFIER WITH ADJUSTABLE UPPER FREQUENCY LIMIT

BACKGROUND OF THE INVENTION

The present invention relates to an amplifier circuit of the type having a variable gain, particularly for use in an automatic, dynamic compander system employed in high fidelity sound reproduction equipment.

The invention is based on an amplifier circuit having a variable transmission factor, i.e., variable gain or attenuation factor, and having a lower limit frequency which is variable by means of a control voltage, and provided with a feedback path between the output of the amplifier and an input which inverts the output signals of the amplifier.

In order to be able to shift the above-mentioned lower limit frequency in a simple manner, the amplifier is designed so that the feedback path includes a parallel circuit of an electronically controllable resistor and a first frequency dependent impedance, a second frequency dependent impedance is connected between the inverting input and a point providing a reference potential, which is normally ground potential, and the control voltage is fed to the control input of the controllable resistor. A circuit of this type is disclosed in U.S. application Ser. No. 703,117, filed by Gerhard Dickopp and myself on July 6, 1976.

Such a shift of the lower limit frequency is required, for example, in order to eliminate certain drawbacks of earlier compander systems.

One such drawback is that, under certain operating conditions, a high amplitude low frequency sound signal is unable to cover high frequency interfering signals, such as noise, for example. If such a high amplitude low frequency signal appears, no noticeable compander effect will take place because of the high signal level. The noise can then be fully heard, for example. If, however, the amplitude of the low frequency signal drops, the compander effect begins. Thus, there occurs the further drawback that the noise is modulated in dependence on the level of the low frequency signal.

In the Dolby system disclosed in German Ausleges-chrift (Published Application) No. 14 87 276, which is a compander system having a first signal path for transmitting the useful signal with linear amplification and full bandwidth and a second signal path which influences the amplification of the useful signal in a certain frequency range as well as an auxiliary circuit which combines the output signals of the two signal paths, the lower limit frequency of the certain frequency range is shifted toward higher frequency values as the amplitude of the useful signal increases. Such an amplitude dependent shift of the lower limit frequency of that frequency range in which there is dynamic regulation enables the above-mentioned difficulties to be substantially avoided.

When the above-described amplifier is used, it is advantageous to provide a control voltage generator which derives a control voltage from the useful signal to be processed and whose output is connected to the input of the controllable resistor.

Such an amplifier has the additional advantage that it can also be used as a filter whose lower limit frequency can be varied by means of the controllable resistor.

SUMMARY OF THE INVENTION

It is an object of the present invention to provide an improved amplifier which can also be used as a filter and whose pass band also presents an upper limit frequency which can be varied so that even when there is a shift of the lower limit frequency of the amplifier the frequency response curve at the upper limit frequency can be shifted along the frequency axis while remaining as parallel as possible to its original position.

This and other objects according to the invention are achieved, in an amplifier circuit arranged to be connected in a useful signal path and having a variable transmission factor and an effective transmission frequency band delimited by a lower limit frequency which can be varied as a function of a control voltage, the circuit including an amplifier member and circuit components defining a feedback path connected between the output of the amplifier member and an input thereof which is inverting with respect to the output signals of the amplifier member, the components defining the feedback path including an electronically voltage-controllable resistor having a control voltage input connected to receive the control voltage and a first frequency dependent impedance connected in parallel with the resistor, and the circuit further including a second frequency dependent impedance connected between the inverting input of the amplifier member and a point at the circuit reference potential, by connecting a circuit component providing a resistive impedance in series with the second frequency dependent impedance.

The amplifier according to the present invention has the advantage, inter alia, when used in a compander system, that the precisely defined upper limit frequency prevents undesirable amplification of very high frequencies, which would endanger the stability of the dynamic control.

DESCRIPTION OF THE PREFERRED EMBODIMENT

Figure 1:
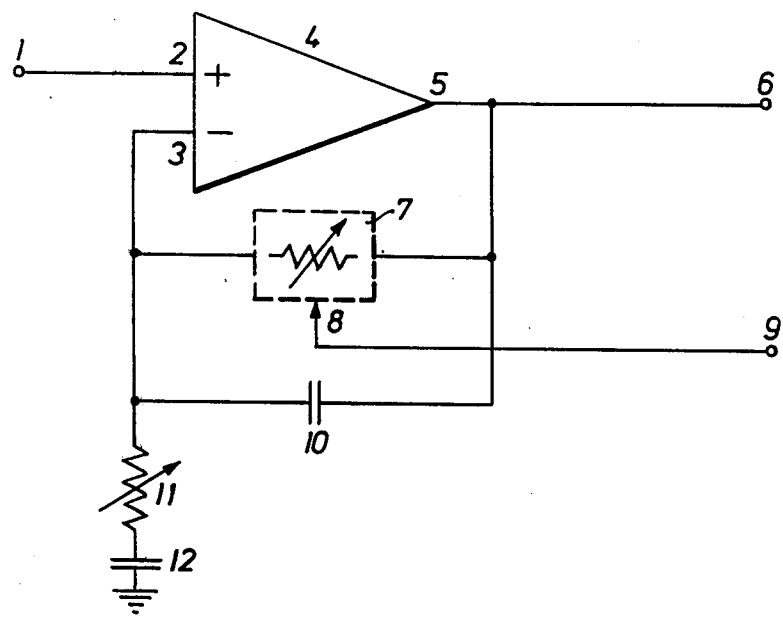
FIG. 1 is a circuit diagram of one preferred embodiment of the invention.

The circuit shown in FIG. 1 includes a differential amplifier 4 having a direct input 2 connected to receive the useful signals to be amplified, which re fed in at input terminal 1. The amplified signals appear at output terminal 6 connected to amplifier output 5 and the effective gain of amplifier 4 can be varied by means of a control voltage applied via terminal 9.

The input terminal 1 may be connected to receive, for example, a low frequency signal which is to be processed in a compander system. From output 5 of differential amplifier 4 a feedback path leads to an inverting input 3 of differential amplifier 4, this feedback path being composed of a parallel connection of an electrically controllable resistor 7 and a capacitor 10. The controllable resistor 7 has a control input 8 which is connected to a control terminal 9 to receive a control voltage for the purpose of varying the resistor resistance value. The controllable resistor 7 is advantageously designed as a field effect transistor. Between the inverting input 3 of differential amplifier 4 and ground there is connected a series arrangement of a variable resistor 11 and a second capacitor 12.

Figure 2:
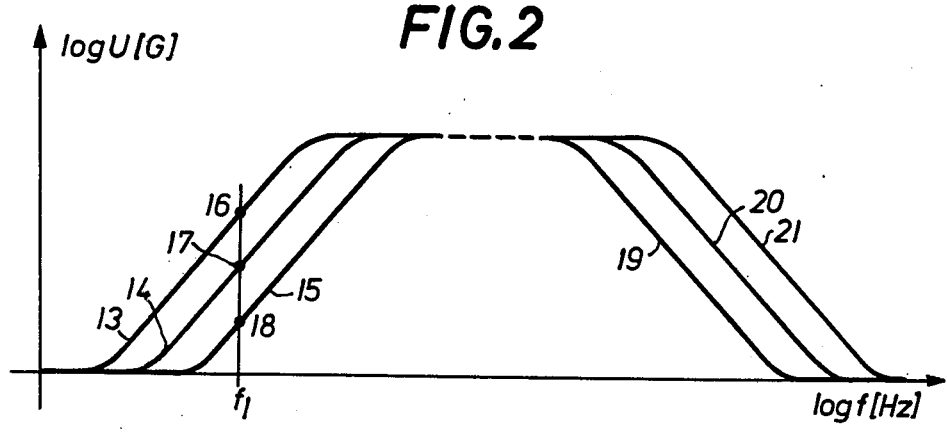
FIG. 2 is a diagram illustrating a family of frequency response characteristics for the circuit of FIG. 1.

The variable frequency response of this circuit is depicted by the response curves shown in FIG. 2, which correspond to selected, exemplary control voltage values. Each curve represents the effective gain, G, of the amplifier, or the log of the output voltage for a constant input voltage, as a function of the log of the signal frequency.

The position of the lower edge of the frequency band on which the circuit is to act is controlled by resistor 7. If, for example, resistor 7 initially has a resistance value which causes the lower frequency band edge characteristic to correspond the curve 14 and the resistance value of resistor 7 is varied by varing the voltage at its control input 8, the characteristic will be shifted from curve 14 purely in translation in a direction parallel to the abscissa, or frequency axis. If, for example, the resistance of resistor 7 is increased, the characteristic will be shifted to correspond to curve 13. If, however, the resistance of resistor 7 is decreased, the characteristic will shift in a direction to correspond to curve 15. It can be seen that the lower limit frequency behavior characteristic of the above-described amplifier can be shifted while remaining exactly parallel to its original position by the action of differential amplifier 4.

The change in amplifier gain which is to occur in the lower frequency region at the same time as the above-described shift of the lower limit frequency characteristic is illustrated by the points of intersection of curves 13, 14 and 15 with a line drawn parallel to the ordinate, or gain axis, at an arbitrarily selected frequency value $f_1$. As can be seen, at a constant frequency $f_1$, and with a constant input signal amplitude, the output signal amplitude will decrease with decreasing resistance value for resistor 7, the output signal amplitudes corresponding to points of intersection 16, 17 and 18 of curves 13, 14 and 15, respectively, with the above-mentioned line.

The above-described shift of the lower limit frequency characteristic of that frequency range in which the amplification of the amplifier of FIG. 1 is to be variable results in a shift of the characteristic curves 13, 14 and 15 purely in horizontal translation so that the curve remains exactly parallel to its original position, as can be confirmed from a simple mathematic calculation for the complex gain of the amplifier of FIG. 1.

A corresponding shift of the limit frequency, however, at the upper end of the transmission range, is produced by varying the resistance of resistor 11 according to the invention.

Insertion of resistor 11 initially assures that the upper limit frequency of the amplifier lies at a predetermined frequency value and does not merely depend on the unpredictable frequency dependent behavior of the other components employed in the circuit.

If resistor 11 initially has a resistance value which causes the upper end of the amplifier frequency band to correspond to curve 20, an increase in the resistance of resistor 11 will cause the characteristic to shift toward curve 19, while a reduction in the resistance of resistor 11 shifts the characteristic toward curve 21.

It can thus be seen that the described amplifier circuit can be used as a bandpass filter whose lower and upper limit frequencies are both shiftable.

The introduction of resistor 11 also presents the advantage that the upper limit frequency characteristic of the amplifier will shift only insignificantly even if the lower limit frequency is changed by varying the resistance of resistor 7. Only if the lower and upper limit frequencies move so close to one another that the transmission range of the circuit no longer has a linear portion will there occur certain deviations from the exactly parallel shift of the frequency response curves. This is insignificant, however, since during normal operation of the described amplifier, e.g. in a compander system, the amplifier will be designed so that the upper limit frequency lies outside of the useful signal frequency range.

In case resistor 11 is made to be variable, it is advantageous to constitute it by a field effect transistor.

It will be understood that the above description of the present invention is susceptible to various modifications, changes and adaptations, and the same are intended to be comprehended within the meaning and range of equivalents of the appended claims.

What is claimed is:

1. In an amplifier circuit arranged to be connected in a useful signal path and having a variable transmission factor and an effective transmission frequency band delimited by a lower limit frequency which can be varied as a function of a control voltage, the circuit including an amplifier member and circuit components defining a feedback path connected between the output of the amplifier member and an input thereof which is inverting with respect to the output signals of the amplifier member, the components defining the feedback path including an electronically voltage-controllable resistor having a control voltage input and a first frequency dependent impedance connected in parallel with the resistor, and the circuit further including a second frequency dependent impedance connected between the inverting input of the amplifier member and a point at the circuit reference potential, and means for supplying the control voltage to the control voltage input of the controllable resistor, the improvement comprising means defining a resistive impedance connected in series with said second frequency dependent impedance for setting the upper limit frequency of the effective transmission band of said circuit at a selected value.

2. An arrangement as defined in claim 1, wherein said means providing a resistive impedance is constituted by a variable resistor whose resistance can be varied for shifting the value of said upper limit frequency.

* * * * *